(12) United States Patent
Pearson et al.

(10) Patent No.: US 7,185,799 B2
(45) Date of Patent: Mar. 6, 2007

(54) METHOD OF CREATING SOLDER BAR CONNECTIONS ON ELECTRONIC PACKAGES

(75) Inventors: Tom E. Pearson, Beaverton, OR (US); Dudi I. Amir, Portland, OR (US); Terrance J. Dishongh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 120 days.

(21) Appl. No.: 10/812,625

(22) Filed: Mar. 29, 2004

(65) Prior Publication Data

US 2005/0211750 A1 Sep. 29, 2005

(51) Int. Cl.
*B23K 31/02* (2006.01)
*H05K 1/11* (2006.01)
(52) U.S. Cl. ............ 228/180.22; 228/246; 174/262
(58) Field of Classification Search ............ 228/175, 228/179.1, 180.22, 56.3, 111.5, 246; 174/260, 174/262, 263
See application file for complete search history.

(56) References Cited

U.S. PATENT DOCUMENTS

| | | | |
|---|---|---|---|
| 5,275,970 A | | 1/1994 | Itoh et al. |
| 5,535,936 A | | 7/1996 | Chong et al. |
| 5,735,452 A | * | 4/1998 | Yu et al. ............ 228/254 |
| 5,847,936 A | * | 12/1998 | Forehand et al. ......... 361/794 |
| 6,078,505 A | * | 6/2000 | Turudic .............. 361/760 |
| 6,222,246 B1 | * | 4/2001 | Mak et al. ............ 257/532 |
| 6,294,405 B1 | * | 9/2001 | Higgins, III ............ 438/108 |
| 6,396,136 B2 | * | 5/2002 | Kalidas et al. .......... 257/691 |
| 6,730,860 B2 | * | 5/2004 | Searls et al. ........... 174/262 |
| 6,754,551 B1 | * | 6/2004 | Zohar et al. ........... 700/121 |
| 2003/0047356 A1 | | 3/2003 | Searls et al. |
| 2003/0157761 A1 | | 8/2003 | Sakuyama |
| 2003/0164395 A1 | | 9/2003 | Tong et al. |

\* cited by examiner

*Primary Examiner*—Kevin Kerns
*Assistant Examiner*—Michael Aboagye
(74) *Attorney, Agent, or Firm*—Blakely, Sokoloff, Taylor & Zafman LLP

(57) ABSTRACT

Solder connections are created between the substrate of an electronic package and a circuit board having lengths that are longer than the width. The solder connections are created by locating solder balls of power or ground connections close enough to one another so that, upon reflow to the circuit board the solder balls combine, creating a larger solder connection. Signal solder balls, however, remain separated. The power or ground solder balls on a particular bond pad are separated from one another by portions of a removable solder mask that keep the solder balls spherical in shape during solder ball attachment to the electronic package. However, it is removed prior to reflow to the circuit board, thus creating a larger, longer solder connection between the electronic package and circuit board.

12 Claims, 6 Drawing Sheets

METHOD OF CREATING SOLDER BAR CONNECTIONS ON ELECTRONIC PACKAGES

BACKGROUND OF THE INVENTION

1). Field of the Invention

This invention relates generally to an electronic assembly, typically of the kind having a package substrate secured to a printed circuit board utilizing solder bumps.

2). Discussion of Related Art

Integrated circuits are often manufactured in and on semiconductor wafers which are subsequently cut into individual semiconductor chips. A chip is then mounted to a package substrate and electrically connected thereto. The package substrate is then mounted to a printed circuit board.

Solder balls are usually located on the surface of the package substrate which is located against the printed circuit board. The combination is then heated and allowed to cool so that the solder balls form solder bumps which secure the package substrate structurally to the printed circuit board, in addition to electrically connecting the package substrate to the printed circuit board.

Electronic signals can be provided through the solder connections between the printed circuit board and the integrated circuit through the electronic package. Other ones of the solder connections provide power and ground to the integrated circuit through the electronic package. It may occur that high currents flow through some of the solder bumps, in particular those providing power or ground to the integrated circuit. These high currents need large electronic conductive paths to transmit power needed to the integrated circuit. Larger solder connections are one way of achieving this need. However, smaller packages are needed to enable cost and design targets and provide the number of solder connections necessary for signal communications. This invention allows the use of larger solder connections for power and ground connections while allowing smaller space solder connections for signal communications.

BRIEF DESCRIPTION OF THE DRAWINGS

The invention is described by way of examples with reference to the accompanying drawings wherein.

DETAILED DESCRIPTION OF THE INVENTION

Figure 1:
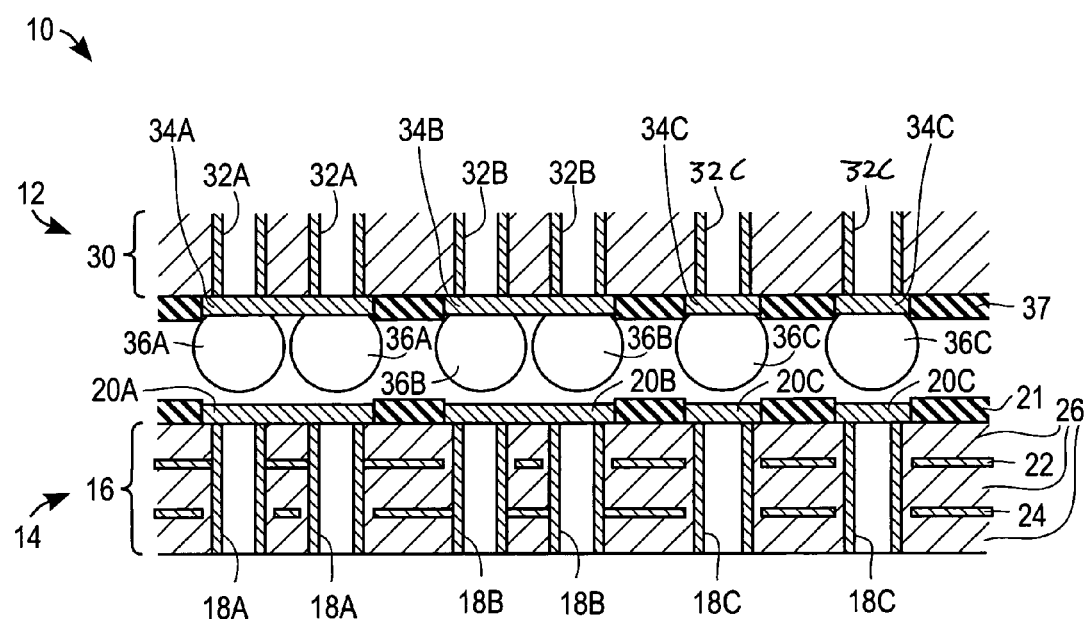
FIG. 1 is a cross-sectional side view illustrating components of an electronic assembly according to an embodiment of the invention.

FIG. 1 of the accompanying drawings illustrates components of an electronic assembly 10 before being secured to one another. The electronic assembly 10 includes a package substrate subassembly 12 and a printed circuit board subassembly 14.

The printed circuit board subassembly 14 includes a printed circuit board 16, vias 18, contact pads 20, and a first permanent solder mask 21.

The printed circuit board 16 includes a number of layers, including a power plane 22, a ground plane 24, and other layers 26. The power plane 22 is separated from a ground plane 24 by one of the layers 26. Another one of the layers 26 is located on top of the power plane 22, and a further one of the layers 26 is located on a lower surface of the ground plane 24. The power and ground planes 20 and 24 are thus separated from one another by one of the layers 26 and spaced from upper and lower surfaces of the printed circuit board 16 by other ones of the layers 26.

The vias 18 are located in the printed circuit board 16 and extend from the upper surface thereof to the lower surface thereof through the planes 22, 24, and layers 26. The vias 18 include power vias 18A, ground vias 18B, and signal vias 18C. The power vias 18A have lower ends connected to the power plane 22. The ground vias 18B have lower ends connected to the ground plane 24. The signal vias 18C are disconnected from the power and ground planes 22 and 24.

The first permanent solder mask 21 is formed over the printed circuit board 16 and patterned to overexpose the contact pads 20. The contact pads 20 include a power contact pad 20A, a ground contact pad 20B, and signal contact pads 20C. The power contact pad 20A has a height measured in a direction from the bottom of the paper to the top of the paper, a width as measured into the paper, and a length as measured from the left to the right of the paper. The length is a multiple of the width. The power contact pad 20A is located on all the power vias 18A. Each one of the power vias 18A is attached and connected to the power contact pad 20A at a respective location along the length of the power contact pad 20A. As such, the power vias 18A connect the power contact pad 20A in parallel to the power plane 22. In another embodiment, the vias may be located outside the contact pads in an arrangement commonly referred to as a "dogbone" configuration.

The ground contact pad 20B, similarly, has a height, a width, and a length which is a multiple of the width. The ground contact pad 20B is located on all the ground vias 18B so that each ground via 18B has a respective upper end connected to the ground contact pad 20B at a respective location along its length.

Each signal contact pad 20C is located on and connected to a respective one of the signal vias 16C. Each signal contact pad 20C is disconnected from every other contact pad 20.

The package substrate subassembly 12 includes a package substrate 30, vias 32, bond pads 34, solder balls 36, and a second permanent solder mask 37.

The package substrate 30 is also a multi-layer substrate having a ground plane and a power plane. The vias 32 include power vias 32A, ground vias 32B, and signal vias 32C. Each one of the power vias 32A has an upper end connected to a ground plane in the package substrate 30 and each one of the ground vias 32B has an upper end connected to a ground plane in the package substrate 30.

The second permanent solder mask 37 is formed on the package substrate 30 and patterned to expose the bond pads 34. The bond pads 34 include the power bond pads 34A, ground bond pads 34B, and signal bond pads 34C, all located on a lower surface of the package substrate 30. Each power bond pad 34A is located on lower ends of respective ones of the power vias 32A, each ground bond pad 34B is located on lower ends of respective ones of the ground vias 32B, and each signal bond pad 34C is located on a respective lower end of a respective signal via 32C.

The solder balls 36 include power solder balls 36A, ground solder balls 36B, and signal solder balls 36C. A plurality of the power solder balls 36A are located on a respective lower surface of a respective one of the power bond pads 34A, a plurality of the ground solder balls 36B are located on a respective lower surface of a respective ground bond pad 34B, and each signal solder ball 36C is located on a respective lower surface of respective signal bond pads 34C.

Figure 1A:
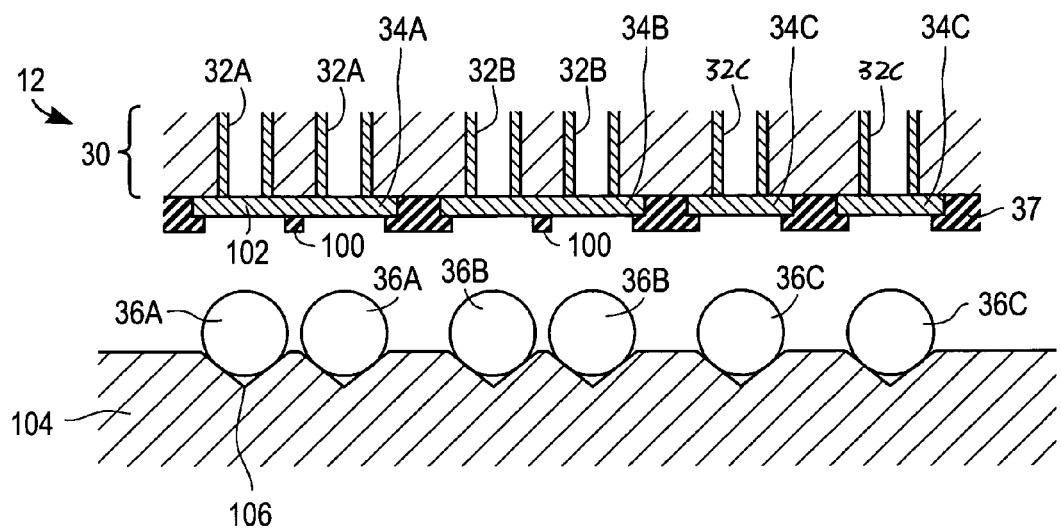
FIGS. 1A to 1C are cross-sectional side views illustrating the use of a removable solder mask to place solder balls of a package substrate subassembly of the electronic assembly.
Figure 1B:
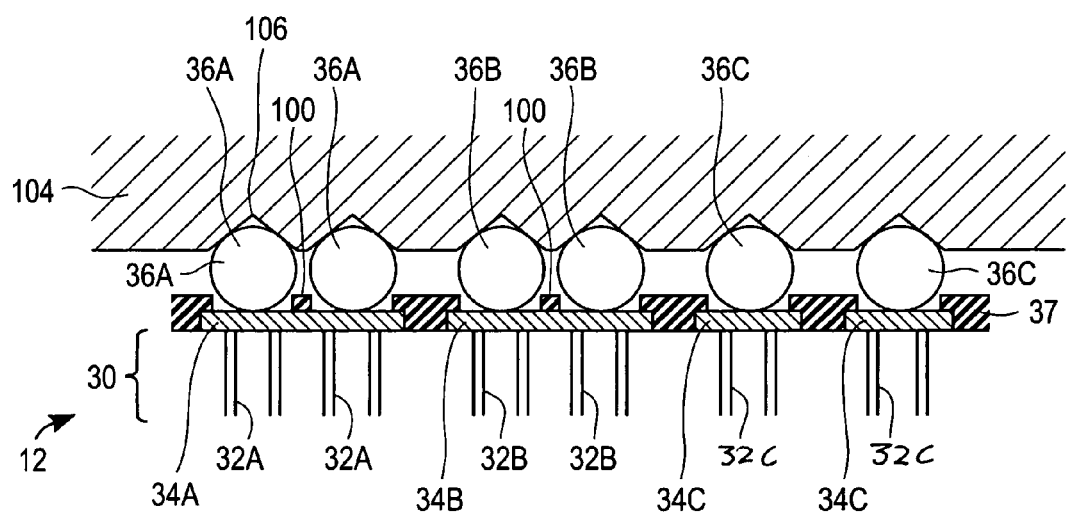
Figure 1C:
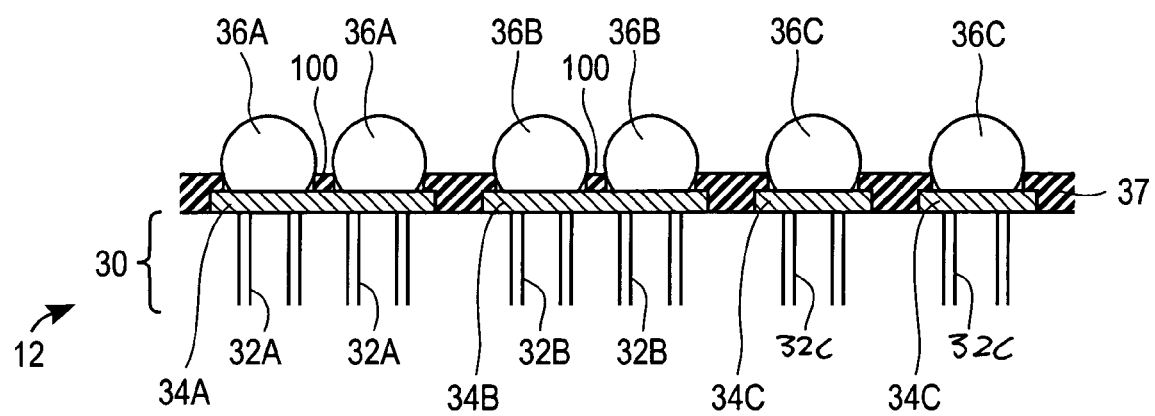

FIGS. 1A to 1C illustrate how the solder balls 36 are attached to the bond pads 34.

Referring first to FIG. 1A, a removable solder mask 100 is formed and patterned so that it is located over select areas of the power and ground bond pads 34A and 34B. The removable solder mask 100 has a plurality of openings 102 formed therein. A plurality of the isolated lands are formed on the power bond bad 34A, a plurality of the isolated lands are formed on the ground bond pad 34B. A jig 104 is provided to hold the solder balls 36. Each one of the solder balls 36 is located in a respective holding formation 106 in the jig 104. The jig 104 and package substrate 30 are then moved toward one another, so that each one of the solder balls 36 is inserted into a respective one of the openings 102.

Illustrated in FIG. 1B is the combination of the package substrate subassembly with the solder balls 36 and the jib 104 after having been flipped. As illustrated in FIG. 1C the jig 104 is then removed and the solder balls remain on the bond pads 34 due to the tackiness provided by the flux on the bond pads 34. The solder balls 36 are then heated and allow to cool. The solder balls 36 melt when they are heated, and again solidify when they are allowed to cool, so that they attach to the bond pads 34. Because separate isolated lands are formed on, for example, the power bond pad 34A, the solder balls 36 do not reflow into one another, allowing the solder balls 36 to keep a spherical shape. By keeping the power solder balls 36A separated from one another, the solder balls can keep their spherical shape and co-planarity to other solder balls. This improves the printed board circuit assembly yields during the attachment process of the electronic package to the printed circuit board. It is believed that printed circuit assembly yields is improved because all of the solder balls 36A, 36B, and 36C are co-planar to each other and reflow in the same manner when subsequently being attached to terminals of a printed circuit board.

The removable solder mask 100 is removed from the package substrate 30 and bond pads 34, e.g., by an aqueous or chemical washing process removing the solder mask 100 away from the surface of the electronic package. Once the removable solder mask 100 is removed, portions of, for example, the power bond pad 34A between the power solder balls 36A are again exposed. The second permanent solder mask 37 remains on the package substrate 30 and is not removed with the removable solder mask 100.

Each respective power via 32A is aligned with one power bond pad 34A, one power solder ball 36A, and one power via 18A. Center points of the power solder balls 36A are spaced from one another by about 1 mm. A center point of the power solder ball 36A on the right is spaced from a center point of the ground solder ball 36B on the left by about 1.2 mm. Center points of the ground solder balls 36B are spaced from one another by about 1 mm. A center point of the ground solder ball 36B on the right is spaced from a center point of the signal solder ball 36C on the left by about 1.2 mm. Center points of the signal solder balls 36C are spaced from one another by about 1.2 mm. All the solder balls 36A, 36B, and 36C have equal mass and size. Therefore, the combined mass of the power solder balls 36A divided by the number of power vias 18A equals the combined mass of the ground solder balls 36B divided by the number of ground vias 18B, and equals the combined mass of the signal solder balls 36C divided by the number of signal vias 18C.

As illustrated in FIG. 2, the assembly is again flipped. The package substrate subassembly 12 is lowered onto the printed circuit board subassembly 14 so that lower surfaces of the solder balls 36 contact upper surfaces of the contact pads 18A. All the power solder balls 36A contact the power contact pad 20A, all the ground solder balls 36B contact the ground contact pad 20B, and each signal solder ball 36C contacts a respective one of the signal contact pads 20C.

The combination of the package substrate assembly 12 and the printed circuit board subassembly 14 is then located in a reflow oven. The solder balls 36 are heated to above their melting temperature so that they melt. The power solder balls 36A combine when they melt due to their relative close spacing and wetting action, and the ground solder balls 36B combine when they melt due to their relative close spacing and wetting action. The power solder balls 36A, however, do not combine with the ground solder balls 36B. The signal solder balls 36C remain disconnected from one another from the ground solder balls 36B and from the power solder balls 36A.

Figure 2:
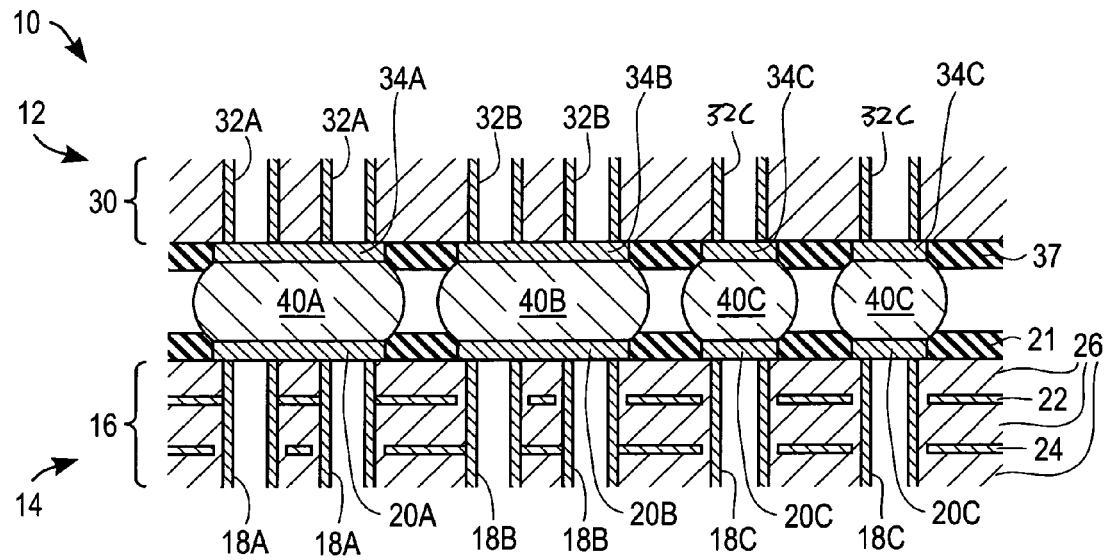
FIG. 2 is a view similar to FIG. 1 after the components are brought together, heated, and allowed to cool.

The combination of the package substrate subassembly 12 and the printed circuit board subassembly 14 is then removed from the reflow furnace and allowed to cool so that the material of the melted solder balls again solidifies. The solidified material of the power solder balls 36A is represented in FIG. 2 of power solder bumps 40B, the combination of the ground solder balls 36B is represented as a ground solder bump 40B, and the melted and reflowed signal solder balls 36C is represented by signal solder bumps 40C.

Each one of the power solder bumps 40A has a height, a width, and a length with the width and length of the power solder bump 40A corresponding to the width and the length of the power contact pad 20A. Similarly, the ground solder bump 40B has a height, a width, and a length, the width and length corresponding to the width and length of the ground contact pad 20B. As such, the power solder bump 40B has a length which is a multiple of its width and the ground solder bump 40B has a length which is a multiple of its width.

Upper ends of the power vias 18A are connected through the power contact pads 20A to respective points of the power solder bump 40A along its length, and upper ends of the ground vias 18B are connected to the ground contact pad 20B to the ground solder bump 40B at respective locations along its length. The power solder bump 40A is thus connected in parallel through the power vias 18A to the power plane 22 and the ground solder bump is connected in parallel through the ground vias 18B to the ground plane 24.

An advantage of combining the power solder balls 36A and combining the ground solder balls 36B is that they can be located closer to one another. More space is also freed up for addition solder balls 36C. Another advantage of combining the power solder balls together is to increase the current transition properties of the solder joint. More solder allows more current to be transmitted with less electrical resistance.

Figure 3:
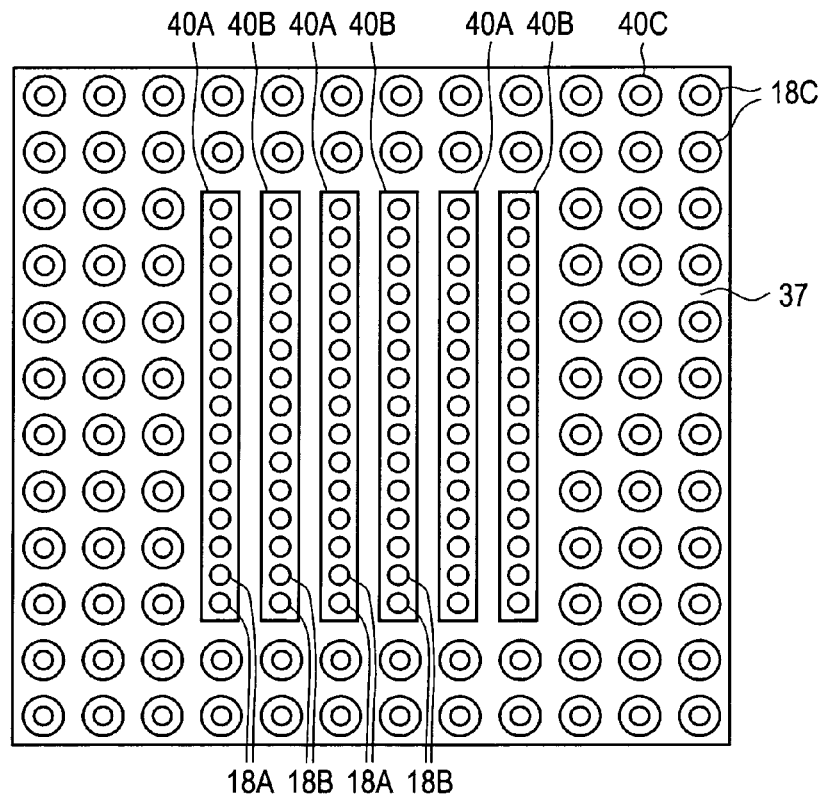
FIG. 3 is a plan view illustrating the layout of solder bumps and vias of a printed circuit board of the electronic assembly.

FIG. 3 is a more accurate representation of the relative positioning of the power and ground solder bumps 40A and 40B. The power and solder bumps 40A and 40B are represented by rectangles. The signal solder bumps 40C are represented by larger circles. The power ground and signal vias 18A, 18B, and 18C are represented by the smaller circles.

It can be seen that the power and ground solder bumps 40A and 40B are located in lines parallel to one another, directly adjacent one another with a respective ground solder bump 40B located between two of the power solder bumps 40A. A surface of one of the power solder bumps 40A thus faces a respective surface of one of the ground solder bumps 40B to form a plurality of capacitors. In the example illustrated, there are three power solder bumps 40A and three ground solder bumps 40D and five capacitors are created. The capacitors assist in reducing resistive and inductive time delay of power or ground signals. All the power and ground vias 18A and 18B are located over a rectangular area where there are none of the signal vias 18C, and all the signal vias are located around the rectangular area where all the power and ground vias 18A and 18B are located.

Figure 4:
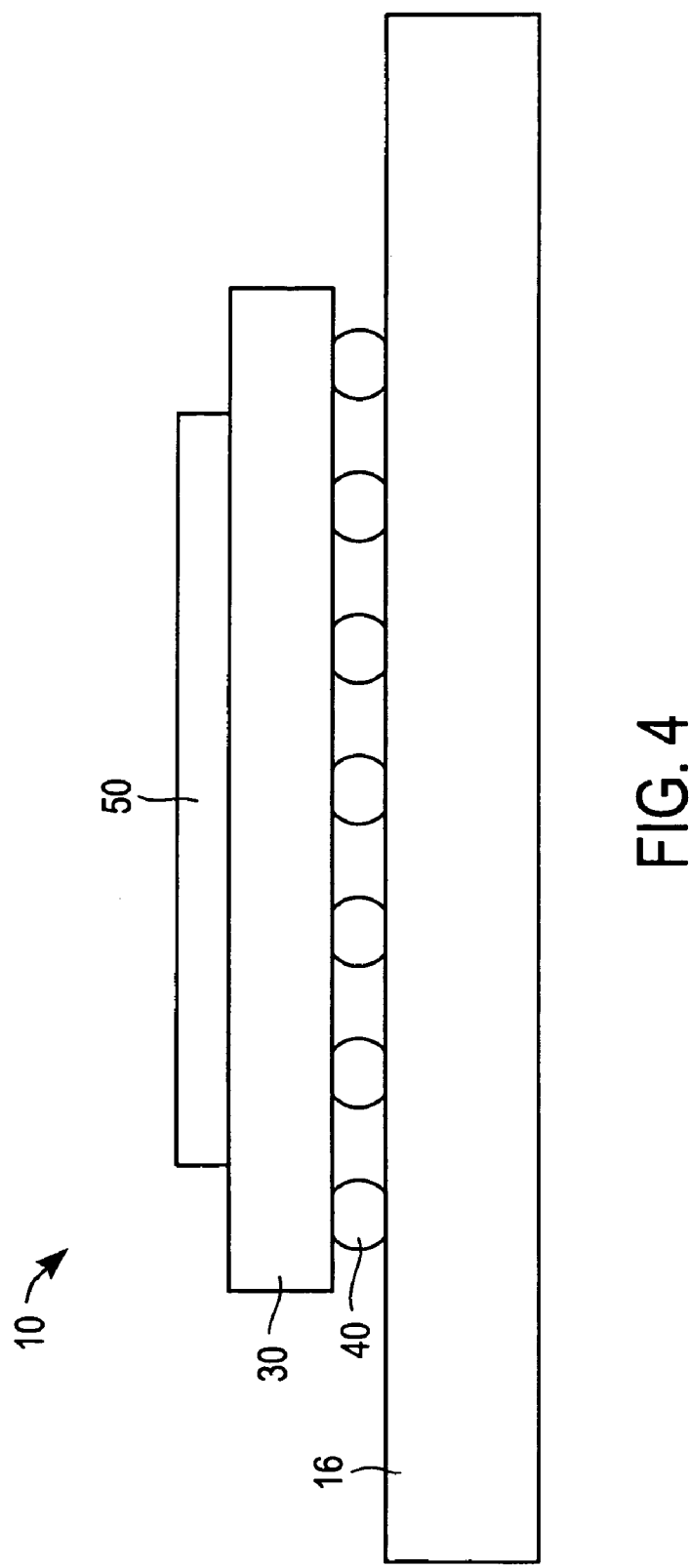
FIG. 4 is a side view illustrating more components of the electronic assembly.

FIG. 4 illustrates more components of the electronic assembly. In addition to the package substrate 30 and the printed circuit board 16, the electronic assembly 10 further includes a semiconductor chip 50. The semiconductor chip 50 has an integrated circuit of electronic components therein. The semiconductor chip 50 is mounted on the package substrate 30 and electrically connected thereto. Electronic signals can be provided to and from the integrated circuit in the semiconductor die 50 and the printed circuit board 16 through the solder bumps 40 and the package substrate 30.

Figure 5:
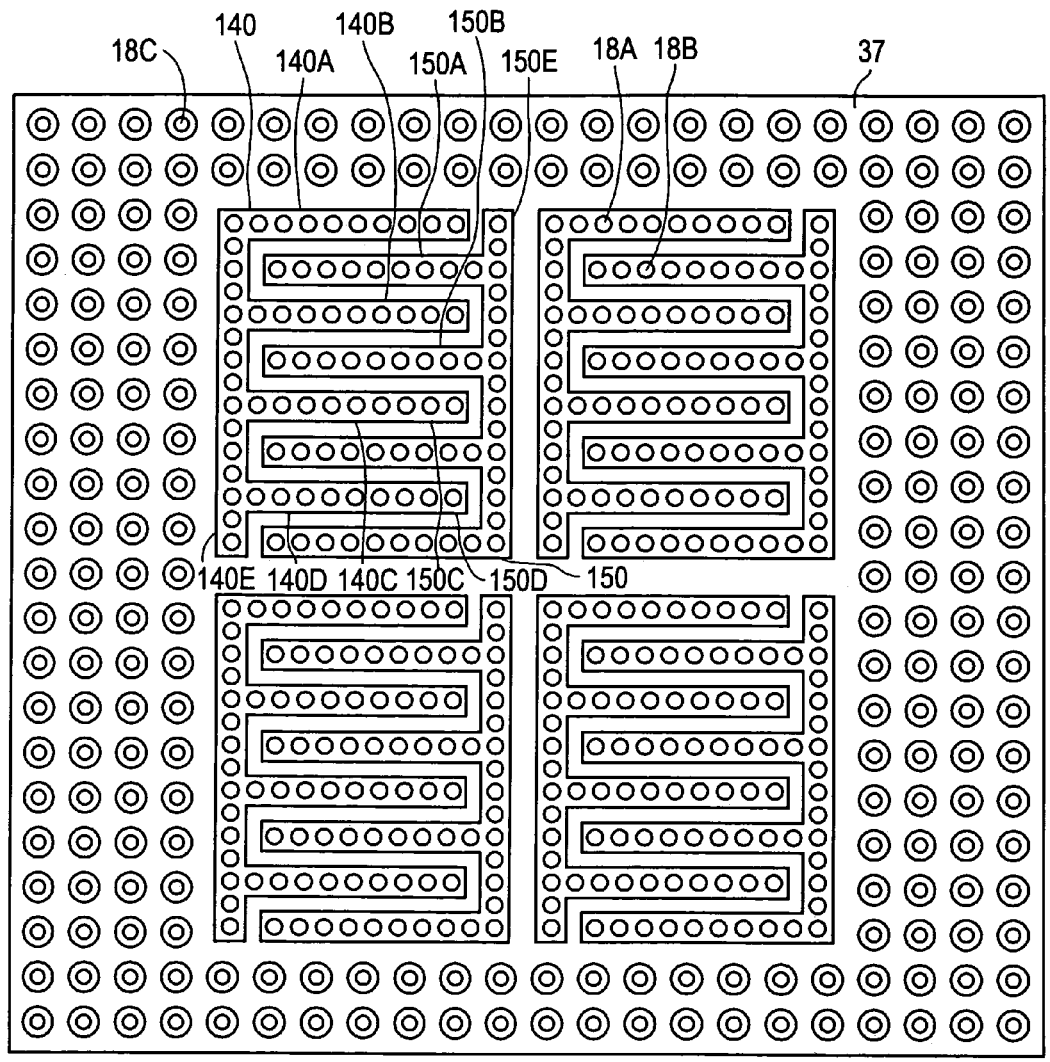
FIG. 5 is a plan view of a printed circuit board according to another embodiment of the invention.

FIG. 5 illustrates another manner in which capacitors can be created with power and ground solder bumps. Similar reference numerals are used as in the embodiment of FIG. 3. A power solder bump 140 has a plurality of limbs 140A–E. The limbs 140A–D all lead off the limb 140E. A ground bump 150 is provided having limbs 150A–E. The limbs 150A–D lead off the limb 150E. The limbs 150A–D are located between the limbs 140A–D so that the limbs 140 are alternated by the limbs 150A–D. It has been found that a larger capacitor can be created over a given surface area by "fanning" the limbs into one another as illustrated in FIG. 5.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of constructing an electronic assembly, comprising:

forming a removable solder mask partially over a conductive power contact pad, of a first substrate, the solder mask leaving a plurality of lands of the conductive power contact pad exposed;

attaching a plurality of power solder balls to the conductive power contact pad and a plurality of signal solder balls to conductive signal contact pads of the first substrate, the power solder balls being spaced from one another by a first distance and the signal solder balls being spaced from one another by a second distance which is larger than the first distance;

removing the removable solder mask;

locating the solder balls against terminals of a second substrate;

heating the solder balls so that they melt, the power solder balls combining with one another while the signal solder balls remain disconnected from one another; and allowing the solder balls to cool so that they solidify.

2. The method of claim 1, wherein one power solder ball has the same mass as one signal solder ball.

3. The method of claim 1, wherein the solder balls include a plurality of ground solder balls spaced from one another by a distance which is less than the second distance, the ground solder balls combining with one another.

4. The method of claim 3, wherein the power and ground solder balls form power and ground solder bumps located directly adjacent one another and have lengths extending substantially parallel to one another so as to have surfaces facing one another to form a capacitor.

5. The method of claim 4, comprising a plurality of power bumps and ground bumps alternating with one another to form a plurality of capacitors.

6. The method of claim 1, wherein the power solder balls before reflow are denser than the signal solder balls.

7. The method of claim 6, wherein the mass of one power solder ball substantially equals the mass of one signal solder ball.

8. A method of constructing an electronic assembly, comprising:

forming a removable solder mask partially over a conductive power contact pad and partially over a conductive ground contact pad of a first substrate, the solder mask leaving a plurality of lands of the conductive power contact pad exposed and leaving a plurality of lands of the conductive ground contact pad exposed;

attaching a plurality of power solder balls to the conductive power contact pad, a plurality of ground solder balls to the conductive ground contact pad, and a plurality of signal solder balls to conductive signal contact pads of the first substrate, the power solder balls and ground solder balls being spaced from one another by a first distance and the signal solder balls being spaced from one another by a second distance which is larger than the first distance;

removing the removable solder mask;

locating the solder balls against terminals of a second substrate;

heating the solder balls so that they melt, the power solder balls combining with one another and the ground solder balls combining with one another while the signal solder balls remain disconnected from one another; and allowing the solder balls to cool so that they solidify.

9. The method of claim 8, wherein the removable solder mask is removed before the solder balls are located against the terminals of the second substrate.

10. The method of claim 8, wherein one power solder ball has the same mass as one signal solder ball.

11. The method of claim 8, wherein the power and ground solder balls form power and ground solder bumps located directly adjacent one another and have lengths extending substantially parallel to one another so as to have surfaces facing one another to form a capacitor.

12. The method of claim 11, comprising a plurality of power bumps and ground bumps alternating with one another to form a plurality of capacitors.

* * * * *